(12) United States Patent
Venkatraman et al.

(10) Patent No.: US 9,762,254 B2
(45) Date of Patent: Sep. 12, 2017

(54) CONTINUOUS TRACKING OF MISMATCH CORRECTION IN BOTH ANALOG AND DIGITAL DOMAINS IN AN INTERLEAVED ADC

(71) Applicant: TEXAS INSTRUMENTS INCORPORATED, Dallas, TX (US)

(72) Inventors: Sashidharan Venkatraman, Hyderabad (IN); Sthanunathan Ramakrishnan, Bangalore (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/230,643

(22) Filed: Aug. 8, 2016

(65) Prior Publication Data

US 2017/0041011 A1 Feb. 9, 2017

(30) Foreign Application Priority Data

Aug. 6, 2015 (IN) .......................... 4091/CHE/2015

(51) Int. Cl.
*H03M 1/06* (2006.01)
*H03M 1/10* (2006.01)
*H03M 1/12* (2006.01)

(52) U.S. Cl.
CPC ....... *H03M 1/0624* (2013.01); *H03M 1/0626* (2013.01); *H03M 1/1009* (2013.01); *H03M 1/1215* (2013.01)

(58) Field of Classification Search
CPC .. H03M 1/0617; H03M 1/1215; H03M 1/124; H03M 1/203; H03M 1/207; H03M 1/06; H03M 1/1023
USPC ................................ 341/155, 118, 119, 120
See application file for complete search history.

(56) References Cited

U.S. PATENT DOCUMENTS

| 7,049,872 | B2* | 5/2006 | Diorio | ........................ | G06F 1/10 327/234 |
| 8,094,050 | B2* | 1/2012 | Sestok | ................ | H03M 1/1061 341/120 |
| 2013/0207822 | A1* | 8/2013 | Snelgrove | ............... | H03M 1/12 341/143 |

* cited by examiner

*Primary Examiner* — Jean B Jeanglaude
(74) *Attorney, Agent, or Firm* — Gregory J. Albin; Charles A. Brill; Frank D. Cimino (57) ABSTRACT

A system includes a first tracking filter configured to track a frequency domain mismatch profile between component analog-to-digital convertors (ADCs) of an interleaved ADC (IADC), and a second tracking filter configured to a track a frequency independent timing delay mismatch and a timing delay mismatch correction error based on frequency domain mismatch profile estimates. An output of the first tracking filter determines a correction of a frequency dependent mismatch profile in an output of the interleaved ADC and an output of the second tracking filter determines a correction of the timing delay mismatch correction error in the output of the interleaved ADC.

23 Claims, 8 Drawing Sheets

CONTINUOUS TRACKING OF MISMATCH CORRECTION IN BOTH ANALOG AND DIGITAL DOMAINS IN AN INTERLEAVED ADC

CROSS-REFERENCE TO RELATED APPLICATIONS

The present application claims priority to Indian Provisional Patent Application No. 4091/CHE/2015, filed Aug. 6, 2015, titled "Continuous Tracking Of Mismatch Correction In Both Analog And Digital Domains In An Interleaved ADC," which is hereby incorporated herein by reference in its entirety.

BACKGROUND

An analog-to-digital converter (ADC, A/D converter, or A to D) is a device that converts a continuous physical quantity (e.g., voltage) into a digital value that represents the quantity's amplitude. The analog-to-digital conversion involves quantization of the input, such that a small amount of error is introduced. Moreover, instead of doing a single conversion, an ADC often performs the conversions ("samples" the input) periodically. The result is a sequence of digital values that have been converted from a continuous-time and continuous-amplitude analog signal to a discrete-time and discrete-amplitude digital signal.

A time-interleaved ADC uses N parallel ADCs where each ADC samples data every Nth cycle of the effective sample clock, where N is a positive integer. The result is that the sample rate is increased N times compared to the sample rate attainable by each individual ADC.

However, mismatches in one or more of the gain, timing and offset between the component ADCs can limit performance of a time-interleaved ADC. Further, these parameter mismatches can be frequency independent and create interleaving images. Thus, systems and methods for correcting for these interleaving images would be beneficial in the art.

BRIEF DESCRIPTION OF THE DRAWINGS

For a detailed description of various examples, reference will now be made to the accompanying drawings in which:

FIGS. 1A-1B ("FIG. 1"), in two parts.

FIGS. 3A-3B ("FIG. 3"), in two parts.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The term "based on" means based at least in part on.

Systems and method are described for determining interleaving mismatches of an interleaved analog-to-digital converter (IADC) signal. The mismatches of in IADC signal in the frequency domain may be estimated to provide correction filters that can be employed to remove the mismatches from the IADC signal, while a frequency-independent delay mismatch may be independently tracked and applied to adjust the clocks applied to the component ADCs.

In general, for an interleaved analog-to-digital converter (ADC) with N number of ADCs (where N is an integer greater than one), there are N−1 spurs. As used herein, the term "spur" corresponds to a spurious tone that interferes with the output of the interleaved ADC. Throughout this disclosure, these spurs are referred to as "images" of tones, since the spurs are correlated to the tones and related to the frequency location of the input in the manner described herein. For purposes of simplification of explanation, throughout this disclosure, an example is employed where there are 4 ADCs. In this situation, for an input tone at a frequency of $f_0$ and an amplitude of $A_0$, an output of the interleaved ADC can have three spurs occur due to the mismatches. In such a situation, the images of the tone can occur at $f_0+f_s/4$ ($f_s$ is the sampling frequency of the interleaved ADC), $f_0+2f_s/4$ and $f_0+3f_s/4$, with respective complex amplitudes of $G_1(f_0)A_0$, $G_2(f_0)A_0$ and $G_3(f_0)A_0$. It is noted that the frequencies $f_0+f_s/4$, $f_0+2f_s/4$, $f_0+3f_s/4$, etc. can be aliased to frequencies between $f_s/2$ and $f_s/2$ due to the ADC sampling. Based on this information, the systems and methods described herein can estimate the three components $G_1(f)$, $G_2(f)$ and $G_3(f)$ for frequencies across a band. The three components can be converted into filter coefficients that can be employed in correction filters to reduce/remove the effects due to the mismatches in the output of the interleaved ADC. Accordingly, the systems and methods described herein can reduce/eliminate mismatches from an interleaved ADC signal.

Figure 1A:
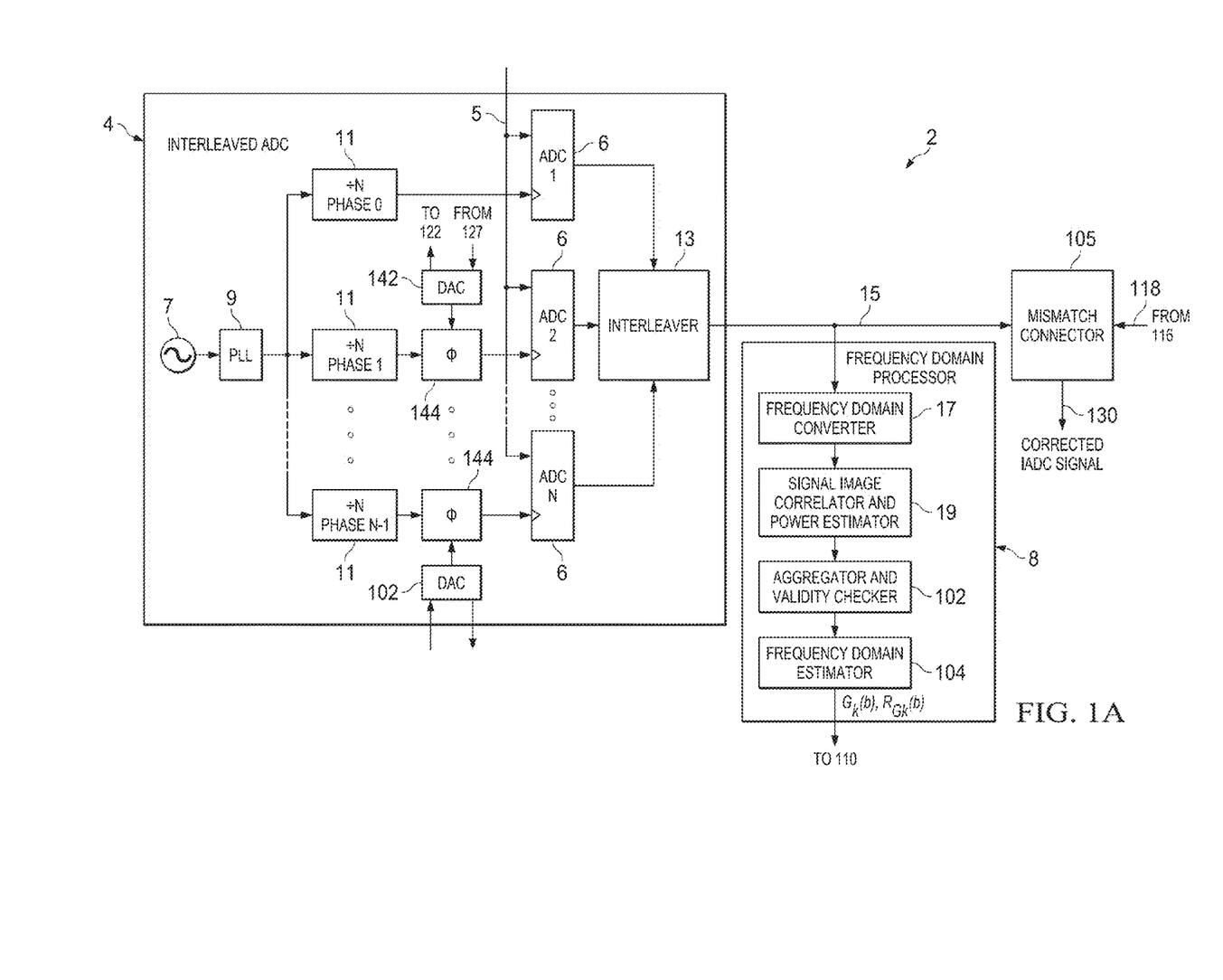
FIGS. 1A, 1B, shows a block diagram of a system in accordance with various examples.
Figure 1B:
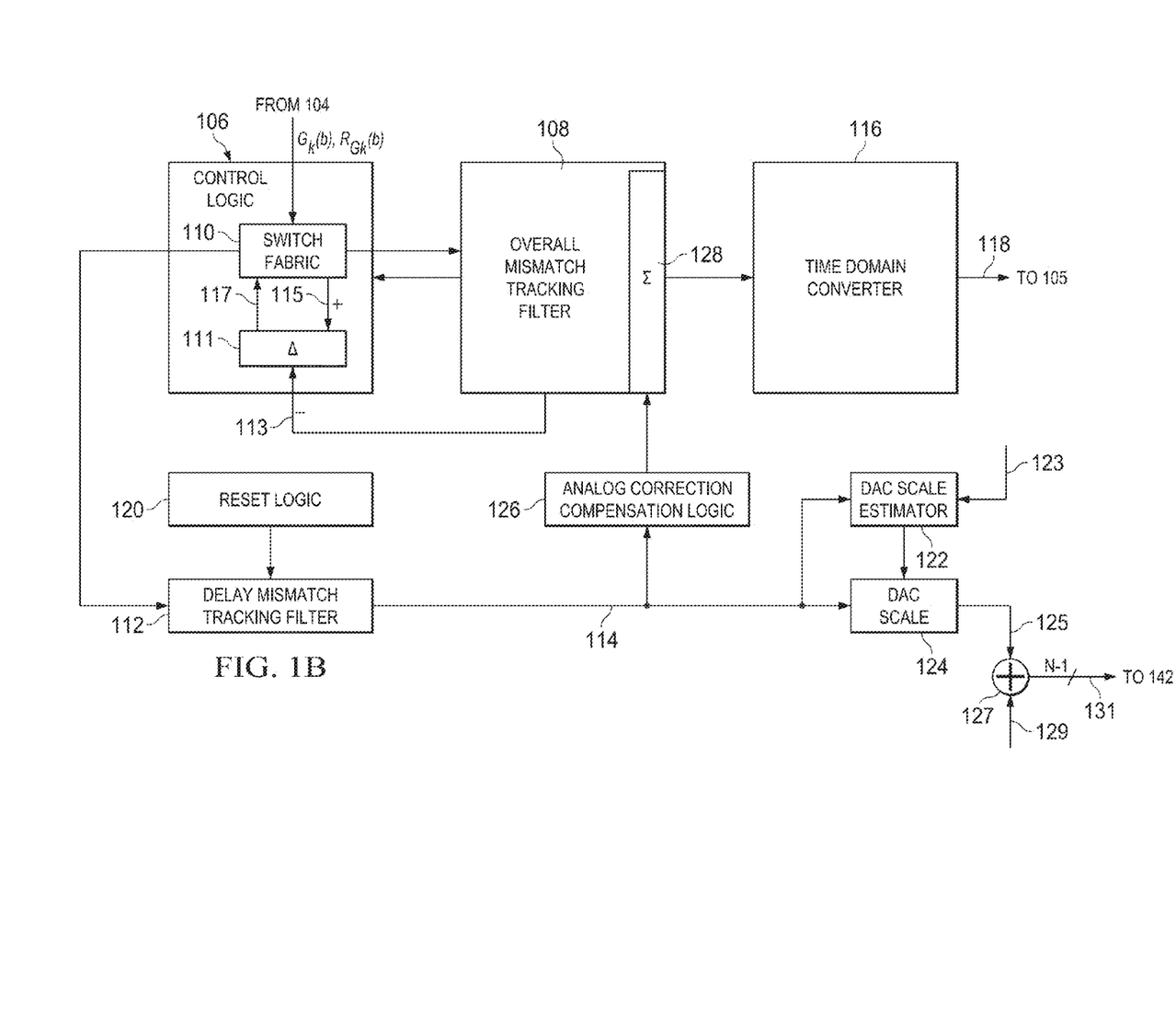

FIG. 1, comprising two parts—FIGS. 1A and 1B, shows a block diagram of a system 2 for correcting mismatches in an interleaved ADC 4, which in some examples can be referred to as an ADC interleaver. The system 2 can be implemented, for example, as a circuit, such as an integrated circuit (IC) chip. For instance, the system 2 could be implemented as an Application Specific Integrated Circuit (ASIC) chip. In some examples, portions of the system 2 can be implemented as firmware accessible by a microcontroller. Additionally or alternatively, some of the blocks illustrated can be implemented as logic implemented on a field programmable gate array (FPGA) or a combination of logic and firmware. Moreover, although each block of the system 2 is shown and described as performing specific functions, it is to be understood that in other examples, the operations of each block can be performed by other blocks and/or in cooperation with multiple blocks.

The interleaved ADC 4 can include an array of N number of ADCs 6 that can sample an analog input signal 5. The interleaved ADC 4 can be a time-interleaved ADC. A sample clock causes each of the N number of ADCs 6 to sample the analog signal. Thus, at each Nth sample, a given ADC 6 samples the analog signal. Output from each of the N number of ADCs 6 is interleaved (e.g., multiplexed) and output as an interleaved ADC ("IADC") signal.

More particularly, in the system 2, a clock signal 7 can be provided to a phase locked loop (PLL) 9 that can provide a phase-locked clock signal to N number of frequency dividers 11. The frequency dividers 11 can each control the sampling of a corresponding ADC 6. In some examples, the PLL 9 can output a clock signal and each frequency dividers 11 can divide the output of the PLL 9 by N. For instance, in situations where the output of the PLL 9 has a frequency of 1 GHz, and there are four (4) ADCs 6, each of the frequency dividers 11 could have an output with a frequency of 250 MHz at different phases. The output from each of the ADCs 6 can be interleaved (e.g., multiplexed) by an interleaver 13 and output as an IADC signal. It is to be understood that in some examples, the clock signal 7 can be generated internally at the interleaved ADC 4 or external to the interleaved ADC 4 and/or the system 2.

Due to inherent fabrication and design tolerances, each individual ADC 6 may have a unique gain, sampling time offset and bandwidth and other unique characteristics. Thus, a given ADC 6 may have at least gain, sampling time instance and bandwidth mismatches or some combination thereof relative to a reference ADC 6. The IADC signal includes N−1 number of spurs that are a result of the mismatches between the individual ADCs 6. The profile of these N−1 spurs as a function of the input frequency can be referred to as a mismatch profile. Accordingly, the IADC output by the interleaved ADC 52 is referred to as an uncorrected IADC signal 15. The system 2 can correct these mismatches.

Figure 2:
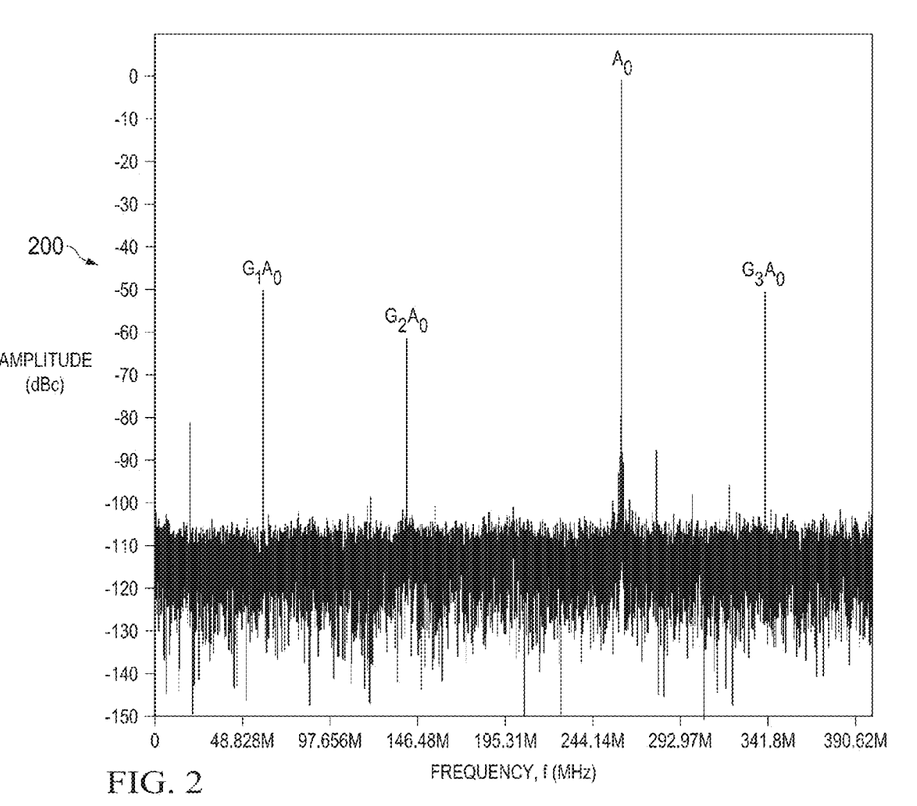
FIG. 2 shows an example graph of an output of an interleaved ADC without mismatch correction.

Due to inherent design tolerances of the component ADCs 6, each individual ADC 6 may have one or more parameter mismatches. By way of example and not limited to the following, each ADC 6 may have a unique gain, sampling time offset and bandwidth that causes a mismatch between each individual ADC 6 and a reference ADC, e.g., a first one of ADCs 6. Let $G_k(f)$ represent a frequency dependent mismatch profile of the interleaved ADC 4. It is noted that although examples are employed that describe individual (constant) tones, the system 2 can also process wideband signals wherein tones change amplitude, phase and frequency over time. For example, consider an input tone at a frequency $f_0$ and an amplitude of $A_0$, with a sampling frequency of $f_s$. As is illustrated in FIG. 2, due to the mismatches the given input tone causes an extra tone with complex amplitude of $G_k(f_0)A_o$ at a frequency of $f_0+k*f_s/N$, where k indexes the interleaving images where in an embodiment of an IADC having N component ADCs 6, there may be N−1 images, and thus, in this example, k takes the values 1, 2, . . . N−1. Thus in, an example with 4 interleaved ADCs, as previously described, an input tone will generate 3 other tones (e.g., images/spurs). FIG. 2 illustrates an example a graph 200 of an uncorrected IADC output represented in the given example. In the graph 200, amplitude of a signal, in decibels relative to a carrier signal (dBc) are plotted as a function of a sampling frequency, $f_s$, in megahertz (MHz). As illustrated in the graph 200, in the given example, there are 3 images of a tone at the frequencies, $f_0+f_s/4$, $f_0+2f_s/4$ and $f_0+3*f_s/4$ with respective complex amplitudes $G_1(f_0)*A_0$, $G_2(f_0)*A_0$ and $G_3(f_0)*A_0$ for the input tone of amplitude $A_0$. In some examples, these frequencies can alias back into $-f_s/2$ $f_s/2$. Note that any transformation of $G_k(f)$ into other equivalent forms also results in a corresponding frequency dependent mismatch profile that is also dependent on the parameter mismatches between the component ADCs of an Interleaved ADC.

In the foregoing the effect of parameter mismatches among component ADCs in an interleaved ADC have been described. However these parameter mismatches need not be associated physically with different component ADCs. For example, even if there is a single ADC converting all the samples, there might be parameter mismatches which vary periodically with time, due to some stray coupling or other effects. For the purpose of illustration, suppose every fourth sample of such an ADC may have the same parameters associated with it, which parameters differ from the three preceding samples. In this case also, the output of the ADC can be treated as if it is Interleaved-by-4 and the principles of the disclosure set forth above also apply. Conceptually, such a system is an equivalent Interleaved ADC and the representation of an interleaved ADC in FIG. 1A would be understood as an equivalent model therefor, and not necessarily a physical realization of an interleaved ADC. Further the phases of the same clock may be adjusted as described hereinbelow in conjunction with DACs 142 and phase shifters 144 (FIG. 1).

Returning to FIGS. 1A, 1B, the uncorrected IADC signal 15 may be provided to a frequency domain processor 8 which can convert the uncorrected IADC signals 15 in the time-domain to frequency domain signals which may then, after further processing, be provided to a pair of tracking filters as described below. Frequency domain processor 8 includes a frequency domain convertor 17 which converts the uncorrected IADC signals 15 from the time domain to the frequency domain. For example, frequency domain converter 17 may perform a fast Fourier transform (FFT) on the uncorrected IADC signals 15. Further, frequency domain convertor 17 may apply a windowing function to the uncorrected IADC signals 15. The windowing function can be implemented, for example, as the Blackman-Harris windowing function. The windowing size can be selected to ensure that window leakage is sufficiently removed from the signal (e.g., a tone), such that the leakage is sufficiently less than the permitted error (e.g., about −100 dBc when the permitted error is −80 dBc) in an estimate of the frequency domain profile, $G_k(f)$. In one example, the windowing function can be implemented, for example, as the Blackman-Harris windowing function with a window length of about 512 samples. In other examples, different window sizes can be employed. The frequency domain processor 8 can provide frequency domain data that characterizes the spectral content of the selected blocks of the uncorrected IADC signal to the two tracking filters, as described hereinbelow. Further, frequency domain converter 17 may perform the windowing and FFT on selected blocks of the uncorrected IADC signals; the selection can be periodic, random or pseudo-random in alternative embodiments of frequency domain convertor 17. The FFT of the selected blocks can be referred to as FFT blocks that characterize the spectral content of the uncorrected IADC signal 15 as a function of contiguous frequency bands referred to as FFT bins. In the description to follow, the frequency dependence of frequency domain mismatch profile estimates will be represented by FFT bin number, b, rather than frequency f. As would be appreciated by one skilled in the art having the benefit of the disclosure, and as described further below, there is a mapping between a frequency f and a bin b.

The frequency domain converter 17 may also apply an initial validity check on the selected blocks of the uncorrected IADC signal and remove blocks that violate certain conditions. For instance, the frequency domain converter 17 may examine the selected blocks to determine if more than a specified number of samples are greater than a saturation threshold in absolute value. If the determination for a block is true, then that block can be rejected. This determination can be employed as a saturation-based FFT block rejection. Accordingly, if a selected sample in a block is higher than a value close to saturation, then that block can be deemed to be nearly saturated and dropped, thereby avoiding problems that arise due to saturation of a signal. Additionally, the frequency domain converter 17 may examine each of the selected blocks to determine if the overall block power is less than a power threshold for a given block. Each of the selected blocks with an overall power below the power threshold can be rejected to avoid cases where there is no real input and only ADC noise is detected as output. Such a rejection of the selected blocks can help facilitate the operation of the tracking filters and help improve the mitigation of the mismatch.

The output of frequency domain converter 17 may be provided to a signal image correlator and power estimator 19. The signal image correlator and power estimator 19 may determine a correlation between tones for each of the FFT bins. Operation of a signal image correlator and power estimator that may be used in at least some embodiments of system 2 is described in the commonly-owned U.S. patent application Ser. No. 14/656,205, filed Mar. 12, 2015, titled "Mismatch Profile", published Sep. 17, 2015 as U.S. Patent Application Publication 2015/0263753, which is hereby incorporated by reference as if fully set forth herein.

The output of signal image correlator and power estimator 19 may be provided to an aggregator and validity checker 102. The aggregator and validity checker 102 may be configured to apply a first validity check that compares the determined power of each tone to a threshold (e.g., of about −40 dBFS). Tones with a power of less than the threshold fail the first validity check and can be rejected from aggregation. Additionally, the aggregator and validity checker 102 may apply a second validity check to determine if a signal-to-image power ratio, is greater than a threshold (e.g., second threshold) to limit estimation errors due to interferer generated bias. Operation of a aggregator and validity checker that may be used in at least some embodiments of system 2 is described in the aforesaid U.S. patent application Ser. No. 14/656,205 which has been incorporated by reference. The output of aggregator and validity checker 102 may be provided to a frequency domain estimator 104. Frequency domain estimator 104 may generate instantaneous frequency dependent mismatch profile estimates $G_k(b)$ which may be provided to the two tracking filters described further below. Operation of a frequency domain estimator 104 that may be used in at least some embodiments of system 2 is described in the aforesaid U.S. patent application Ser. No. 14/656,205 which has been incorporated by reference.

The instantaneous frequency domain mismatch profile estimates $G_k(b)$ from frequency domain estimator 104 may be coupled to a pair of tracking filters via control logic 106. Switch fabric 110 steers the flow of the frequency domain estimates from frequency domain estimator 104 to the two tracking filters, a first tracking filter, which may be referred to as an overall mismatch tracking filter (OMTF) 108 a second tracking filter, which may be referred to as a delay mismatch tracking filter (DMTF) 112. Switch fabric 110 may comprise a plurality of switches controlled via control logic 106 based on a set of gating signals, as described further below in conjunction with FIG. 3. Control logic 106 is configured to couple a frequency domain mismatch profile estimate to each of the two tracking filters based on each frequency bin in the frequency domain. In other words, switch fabric 110, under control of control logic 106, steers the flow on a bin-wise basis. Stated otherwise, the flow is directed for each frequency bin in the frequency domain. Control logic 106 may also include a differencing block (Δ) 111 that may be used to form the difference between a subtraction signal, as described further hereinbelow in conjunction with FIG. 3, and the frequency dependent mismatch profile estimates from frequency domain estimator 104. Although Δ 111 is illustrated as integrated in OMTF 108, in at least some embodiments, Δ 111 may be implemented as a separate logic block, and a person of ordinary skill in the art having the benefit of the disclosure would appreciate that architecturally such implementations are equivalent.

The OMTF 108 tracks frequency domain mismatch profiles over time, as adjusted for timing delay mismatches corrected in an analog loop, as described further below. In other words, an OMTF 108 tracks a frequency domain mismatch profile formed from parameter mismatches between the component ADCs 6, as described above. The OMTF 108 output may be referred to as a filtered frequency domain mismatch profile. In at least some embodiments, OMTF 108 may be implemented as a Kalman filter. The operation of an OMTF that may be used in at least some embodiments of an OMTF 108 is described in the aforesaid U.S. patent application Ser. No. 14/656,205 which has been incorporated by reference. An output of the OMTF 108 may determine a correction of frequency dependent mismatch errors in the output of the IADC 4. For example, the output of OMTF 108 may be provided to a time domain converter 116 which outputs a set of filter coefficients 118 to mismatch corrector 105. Mismatch corrector 105 outputs a corrected IADC signal 130. The operation of a time domain convertor 116 and mismatch corrector 105 which may be used in at least some embodiments is described in the commonly-owned U.S. patent application Ser. No. 14/656,122, filed Mar. 12, 2015, titled "Mismatch Corrector", published Sep. 17, 2015 as U.S. Patent Application Publication 2015/0263749, which is hereby incorporated by reference as if fully set forth herein. The operation of OMTF 108 in conjunction with DMTF 112 will also be described in conjunction with FIG. 3 below A DMTF 112 tracks delays alone. As described further below, the output of DMTF 112 may comprise on an iterative basis, a frequency-independent timing delay mismatch estimate which may be used to determine a correction of the timing delay mismatch, and an estimate of a timing delay mismatch correction error based on the corrected timing delay mismatch. Thus, the output of the DMTF 112 may further determine a correction of the timing delay mismatch correction error in the output of the IADC 4. Stated differently, the DMTF 112 tracks, for each of N−1 component ADCs 6, a timing delay mismatch relative to a reference one of the component ADCs 6. The timing delay mismatch estimate may be provided to a DAC scale estimator 122 and DAC scale logic 124 which may comprise logic configured to adjust a phase of clock signals to the component ADCs 6. Thus, as described further below, DAC scale estimator 122 may input a DAC timing code increment 123. In at least some embodiments, DAC timing code increment 123 may be stored by DAC scale estimator 122 from a previous iteration of a timing delay mismatch error estimate, as described further below in conjunction with FIG. 3. Based on the DAC timing code increment, timing delay mismatch estimate and a timing delay mismatch correction error estimate, as defined below, determine a new DAC scale. The new DAC scale estimate is provided to DAC scale logic 124 which outputs an updated incremental DAC code 125. A summing block 127 adds the updated incremental DAC code to the current DAC codes 129 to generate updated DAC codes 131 which are provided to DACs 142. In response, each of the DACs 142 sends a new control signal, which may be a voltage or a current for example, to the corresponding phase shifter 144. The phase shift thereby introduced in the clock to the corresponding ADC 6 provides a correction to the delay mismatch in the respective one of ADCs 6. Stated otherwise, an output of each DAC 142 is coupled to a respective one of the phase shifters 144 which is configured to shift a phase of its respective clock signal based on the output of the corresponding DAC 142, which phase-shifted clock is coupled to the clock input of the respective one of the component ADCs 6. Thus, the DMTF 112, DAC scale estimator 122, DAC scale logic 124, DACs 142 and phase shifters 144 may comprise an analog loop to correct the frequency independent delay mismatches of the component ADCs 6. The operation of DAC scale logic 124 and DAC scale estimator 122 will also be described further in conjunction with FIG. 3.

System 2 also includes reset logic 120 and analog correction compensation logic 126. Reset logic 120 operates to reset DMTF 112. Analog correction compensation logic 126 operates in conjunction with a summing block (Σ) 128 to adjust the frequency-dependent mismatch profile estimates from OMTF 108 based on the frequency independent delay correction in analog. Although Σ 128 is illustrated as integrated in OMTF 128, in at least some embodiments, Σ 128 may be implemented as a separate logic block, and a person of ordinary skill in the art having the benefit of the disclosure would appreciate that architecturally such implementations are equivalent. The operation of reset logic 120 and analog correction mismatch logic 126 are further described in conjunction with FIG. 3.

Figure 3A:
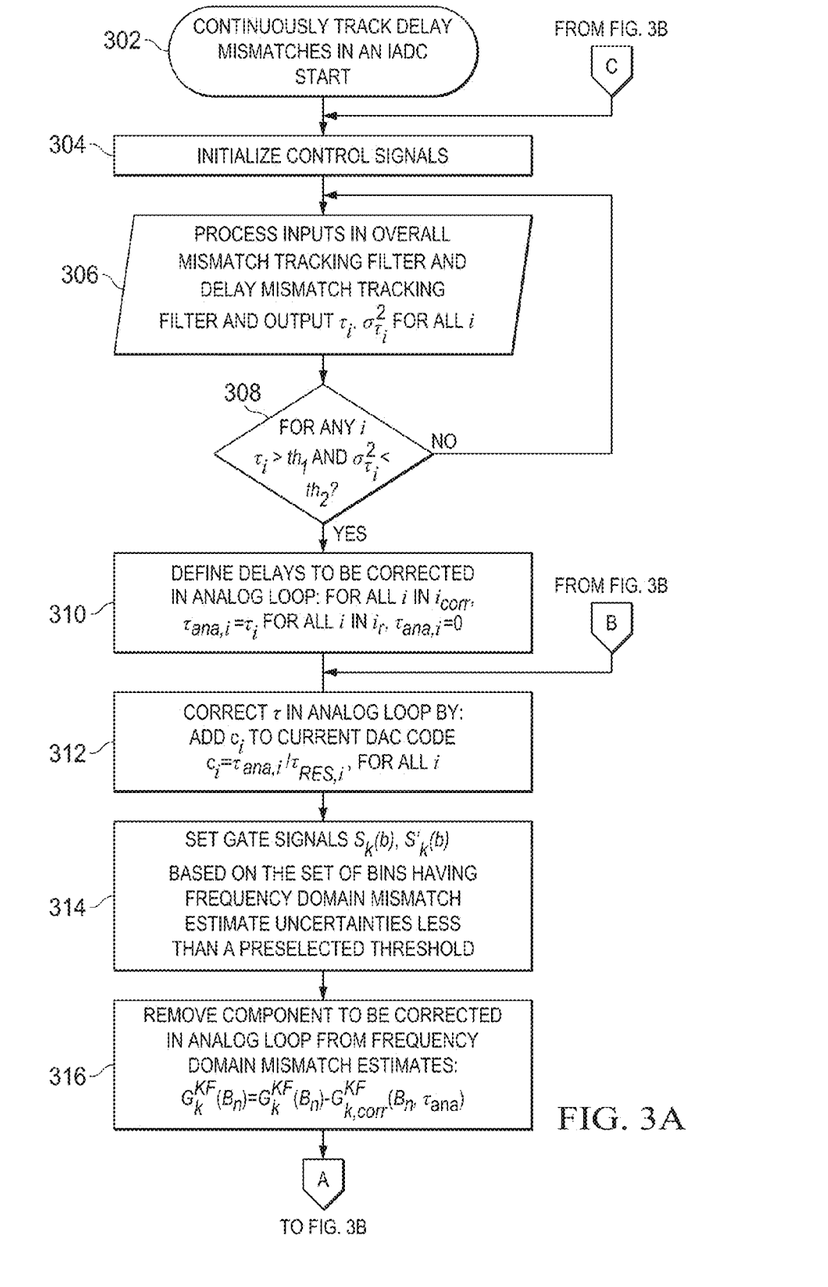
FIGS. 3A, 3B, shows a flow chart of a method in accordance with various examples
Figure 3B:
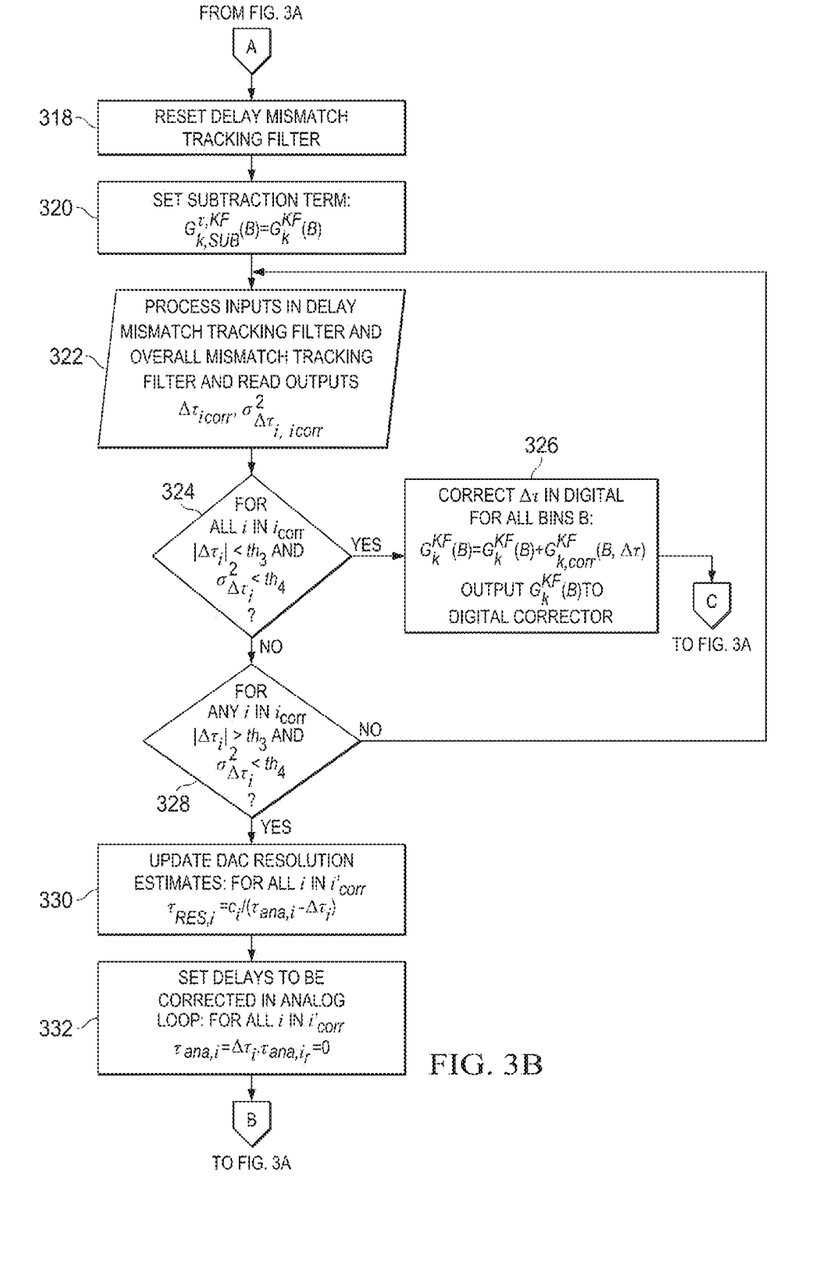

Turning now to FIG. 3, a flow chart of a method 300 comprising continuously tracking a delay mismatches in an interleaved analog-to digital converter (IADC) starts at block 302. In a first phase, which may be referred to as an all-estimation phase, a frequency dependent interleaving mismatch is estimated, which is then used for correcting the frequency-dependent mismatch in the output of the IADC. Concurrently, the second tracking filter estimates a frequency independent timing delay mismatch for all of the N−1 component ADCs. When the estimated timing delay mismatches satisfy the conditions shown in block 308 and described further below, they are then used for correction of the timing delay mismatch in analog. This is described further in conjunction with blocks 310 and 312. If the DAC scaling were correctly known, then the timing delay mismatch would be corrected in analog. When the timing delay mismatch is corrected in analog, the frequency dependent mismatch profile estimated in the OMTF is also modified to account for the correction of the timing delay mismatch, as described below in conjunction with in block 316. This enables the output of the OMTF to be the exact mismatch estimate if the timing delay mismatch is corrected accurately in analog as described above. If the DAC scaling were known, then the correction is also known and the frequency dependent mismatch post-correction would also be available at the OMTF output. The all-estimation phase comprises blocks 304-310 and 326, described further below.

Figure 4:
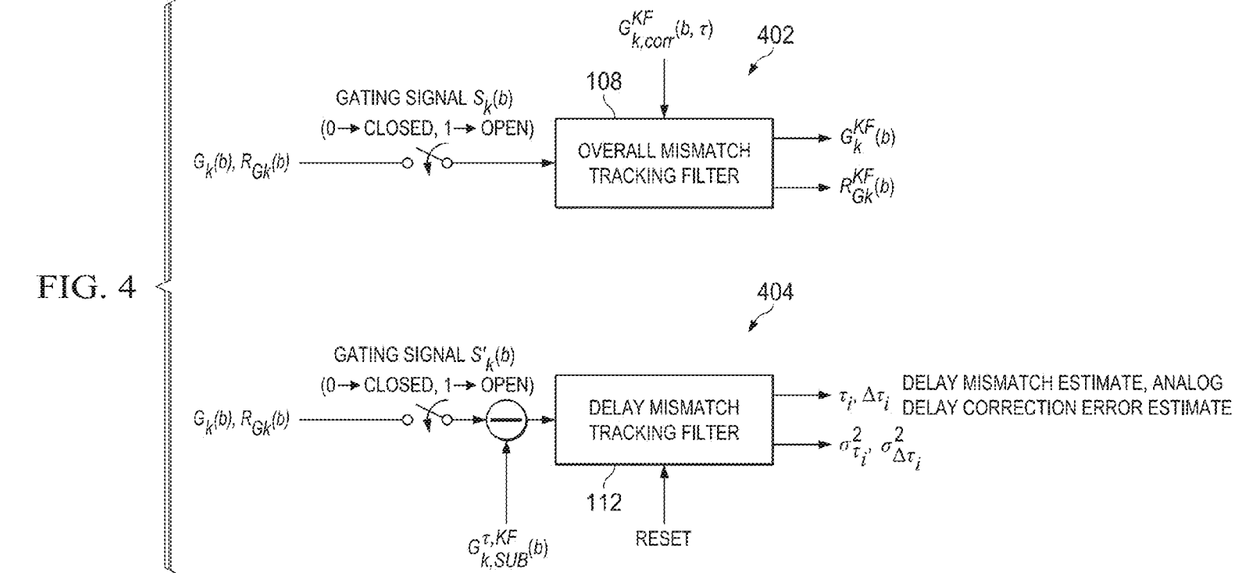
FIG. 4 shows input-output diagrams in accordance with various examples.

However, typically, the DAC scale is not accurately known and, further, the DAC scale may also change across DAC codes. Consequently, the OMTF output may not fully represent the residual frequency dependent mismatch and correcting that using the mismatch corrector 105 (FIG. 1A), referred to hereinafter as correcting in digital, or simply digital correction, would be not completely accurate. The error in the OMTF output is due to the unknown timing delay mismatch error introduced by the timing delay mismatch correction in the analog loop. Thus, in a second phase following the first phase, this residual frequency-independent timing delay mismatch correction error, referred to as simply the timing delay mismatch correction error hereinafter, in the output of the IADC is estimated and corrected. The second phase may be referred to as the delay-only estimation phase. Stated otherwise, the delay-only estimation phase may be summarized as follows: the frequency dependent mismatch profile estimates at the OMTF output are subtracted from the instantaneous frequency dependent mismatch profile estimates. This difference may effectively correspond, in some examples, only to the error in the timing delay mismatch correction in analog alone. This difference then is used to estimate the timing delay mismatch correction error. The DAC scale may then be updated based on the actual timing delay (computed as difference between expected timing delay mismatch correction and residual timing delay mismatch correction error) introduced by the last updated incremental DAC code. The estimated residual timing delay mismatch correction error may be corrected either in analog or in digital. The update to the OMTF estimates needs to be done appropriately in either case as described further hereinbelow. The delay-only estimation phase comprises blocks 312-324 and 328-332, and is described further below Turning to block 304, control signals are initialized. In particular a set of gating signals, $S_k(b)$ and $S'_k(b)$ which may be used to set the state of switches, or gates, comprising switch fabric 110 (FIG. 1) may be set. Here the subscript k indexes the interleaving images and, in the exemplary embodiment in FIG. 1, may take values in the interval [1, N−1]. Each frequency component in the frequency domain may be switched individually, each component has a corresponding control signal as represented by the argument, b. The argument b takes integer values in the interval [1, ($N_{FFT}/2-1$), where $N_{FFT}$ is the number of samples in the FFT. For example, if the sampling frequency of the ADCs is $F_s$, then the bin resolution, $f_{RES}$ is $F_s/N_{FFT}$. The gating signals $S_k(b)$ control the steering of the frequency dependent mismatch profile estimates to an OMTF 108 and the gating signals $S'_k(b)$ control the steering of the frequency dependent mismatch profile estimates to a DMTF 112. This may be further appreciated by referring to FIG. 4 showing an input-output diagram 402 for an OMTF 108 and an input-output diagram 404 for a DMTF 112. In the example of FIG. 4, values of $S_k(b)$ and $S'_k(b)$ equal to 1 open the gates, or switches, and, conversely values of $S_k(b)$ and $S'_k(b)$ equal to 0 close the gates. For example, if, for a particular value of b, $S_k(b)$ or $S'_k(b)$ is 0, an instantaneous frequency dependent mismatch profile estimate, at bin b is coupled to an OMTF 108 or DMTF 112, as the case may be.

In block 306, the instantaneous frequency dependent mismatch profile estimates $G_k(b)$ and corresponding uncertainties $R_{Gk}(b)$ that are coupled to the inputs of an OMTF 108 and an DMTF 112 in response to the gating signals $S_k(b)$, $S'_k(b)$ are processed in the OMTF and the DMTF to generate the respective outputs, filtered frequency domain mismatch profile estimates $G^{KF}_k(b)$, and mismatch estimate uncertainties $R^{KF}_{Gk}(b)$ of the OMTF and timing delay mismatch estimate $\tau_i$ and delay mismatch estimate uncertainty $\sigma_{\tau_i}^2$. Here, the index, i runs over the number of component ADCs 6 whose mismatches relative to a reference component ADC 6 are to be estimated. These are also shown in input/output diagrams 402, 404 in FIG. 4. The processing of frequency dependent mismatch profile estimates in an OMTF 108 is described in U.S. patent application Ser. No. 14/656,205, U.S. Application Publication 2015/0263749, which has been incorporated herein by reference hereinabove.

The processing of frequency dependent mismatch profile estimates by a DMTF 112 in accordance with at least some embodiments will now be described in the context of an exemplary embodiment of an IADC 4 having four component ADCs 6. Thus, the index, k of frequency domain mismatches $G_k(b)$ take the values 1, 2, 3. A DMTF 112 may, in at least some embodiments comprise a Kalman filter. In particular, DMTF 112 may comprise a Kalman filter that maintains three internal states which may be denoted, in the equations to follow, $\tau_{G1R}$, $\tau_{G1I}$, $\tau_{G2}$. These are then processed to get the $\tau_i$ and $\sigma_{\tau i}^2$. In the example, IADC comprising four component ADCs, i takes the values 1, 2, 3.

The initial conditions of the exemplary Kalman filter are defined in Equations (1) and (2):

$$\tau_{G_{1R}}{}^{KF} = \tau_{G_{1I}}{}^{KD} = \tau_{G_2}{}^{KF} = \text{(the initial values for the DMTF Kalman filter states)} \quad (1),$$

The initial uncertainties for the delay Kalman filter states may be set to a large value, denoted inf in equation (2), such that the initial Kalman gains, $K_1$, $K_2$, $K_3$, defined in equation (9) below are essentially equal to 1. Thus, $$R_{G_{1R}}{}^{KF} = R_{G_{1I}}{}^{KF} = R_{G_2}{}^{KF} = \inf \quad (2)$$

The Kalman filter may then be updated in accordance with Equations (3)-(12) as will now be described.

The time update may be given by:

$$R_{G_{1R}}{}^{KF} = R_{G_{1R}}{}^{KF} + Q \quad (3)$$

$$R_{G_{1I}}{}^{KF} = R_{G_{1I}}{}^{KF} + Q \quad (4)$$

$$R_{G_2}{}^{KF} = R_{G_2}{}^{KF} + Q \quad (5)$$

where Q is the process noise variance for the delay Kalman filter states. The measurement update may be given by the following equations, for $G_k(b)$ valid for k=1, 2, 3, and for $$b = 1, 2, \ldots \frac{N_{FFT}}{2} - 1:$$

Compute the instantaneous estimates and uncertainties, equations (6)-(8), and the Kalman filter estimates in Equations (9)-(12):

$$\tau_{G_{1R}}^{INST} = \frac{\text{Re}[G_1(b)] - \text{Re}[G_3(b)]}{2b}, \quad (6)$$

$$R_{G_{1R}}^{INST} = \frac{R_{G_1}(b) + R_{G_3}(b) + R_{EXT}}{8b^2}$$

$$\tau_{G_{1I}}^{INST} = \frac{\text{Im}[G_1(b)] + \text{Im}[G_3(b)]}{2b}, \quad (7)$$

$$R_{G_{1R}}^{INST} = \frac{R_{G_1}(b) + R_{G_3}(b) + R_{EXT}}{8b^2}$$

$$\tau_{G_2}^{INST} = \frac{\text{Im}[G_2(b)]}{b}, \quad R_{G_2}^{INST} = \frac{R_{G_2}(b) + R_{EXT}}{2b^2}, \quad (8)$$

where $R_{EXT}$ is an additional uncertainty term to account for a frequency dependent delay component. Re[x] corresponds to the real part of x, and Im[x] corresponds to the imaginary part of x. The additional uncertainty term, $R_{EXT}$ may be dependent on whether the current phase is all estimation phase or delay only estimation phase. In the all estimation phase which pertains to block 306, $R_{EXT}$ may be chosen to be equal a pre-selected value $R_{EXT,ALL\_EST}$. For example, in at least some embodiments, $R_{EXT,ALL\_EST}$ may have the value $10^{-6}$, which corresponds to uncertainty of −60 dB. The value of $R_{EXT}$ in the delay only estimation phase will be described in conjunction with block 322 below. The Kalman gains may be computed by:

$$K_1 = \frac{R_{G_{1R}}^{KF}}{R_{G_{1R}}^{KF} + R_{G_{1R}}^{INST}}, K_2 = \frac{R_{G_{1I}}^{KF}}{R_{G_{1I}}^{KF} + R_{G_{1I}}^{INST}}, K_3 = \frac{R_{G_2}^{KF}}{R_{G_2}^{KF} + R_{G_2}^{INST}} \quad (9)$$

and the states updated by:

$$\tau_{G_{1R}}{}^{KF} = \tau_{G_{1R}}{}^{KF} + K_1(\tau_{G_{1R}}{}^{INST} - \tau_{G_{1R}}{}^{KF}) \quad (10)$$

$$\tau_{G_{1I}}{}^{KF} = \tau_{G_{1I}}{}^{KF} + K_2(\tau_{G_{1I}}{}^{INST} - \tau_{G_{1I}}{}^{KF}) \quad (11)$$

$$\tau_{G_2}{}^{KF} = \tau_{G_2}{}^{KF} + K_3(\tau_{G_2}{}^{INST} - \tau_{G_2}{}^{KF}), \quad (12)$$

and the respective uncertainties updated by:

$$R_{G_{1R}}{}^{KF} = (1 - K_1)R_{G_{1R}}{}^{KF}, R_{G_{1I}}{}^{KF} = (1 - K_2)R_{G_{1I}}{}^{KF}, R_{G_2}{}^{KF} = (1 - K_3) \quad (12)$$

The output timing delay mismatch estimates and their respective uncertainties may be determined as in Equations (13)-(19). First defining:

$$\tau_{G1} = \tau_{G1R} + j\tau_{G1I}, \quad (13)$$

$$\tau_{G2} = 0 + j\tau_{G2}, \quad (14)$$

$$\tau_{G3} = -\tau_{G1R} + j\tau_{G1I}, \text{ and} \quad (15)$$

$$\tau_{G0} = -(\tau_{G1} + \tau_{G2} + \tau_{G3}). \quad (16)$$

The delays and their respective uncertainties may be determined in terms of the aforesaid defined quantities as:

$$\tau_1 = \frac{\text{Im}(\tau_{G0} + j\tau_{G1} - \tau_{G2} - j\tau_{G3})}{2\pi f_{RES}}, \quad (17)$$

$$\sigma_{\tau_1}^2 = \frac{4(R_{G_{1R}}^{KF} + R_{G_{1I}}^{KF}) + 4R_{G_2}^{KF}}{(2\pi f_{RES})^2}$$

$$\tau_2 = \frac{\text{Im}(\tau_{G0} - \tau_{G1} + \tau_{G2} - \tau_{G3})}{2\pi f_{RES}}, \quad (18)$$

$$\sigma_{\tau_2}^2 = \frac{8(R_{G_{1R}}^{KF} + R_{G_{1I}}^{KF})}{(2\pi f_{RES})^2}$$

$$\tau_3 = \frac{\text{Im}(\tau_{G0} - j\tau_{G1} - \tau_{G2} + j\tau_{G3})}{2\pi f_{RES}}, \sigma_{\tau_3}^2 = \sigma_{\tau_1}^2. \quad (19)$$

As described above, $f_{RES}$ is the FFT-bin resolution. The foregoing equations are applicable to the first Nyquist band, that is, for input frequencies to the IADC within the range of 0 to $F_s/2$, where $F_s$ is the ADC sampling frequency. To account for input signals in higher Nyquist bands, the bin index, b, may be redefined in accordance with the following equation 20:

$$b = \begin{cases} b - \dfrac{NyqBand}{2} * N_{FFT}, & \text{if } NyqBand \text{ is even} \\ b + \dfrac{NyqBand - 1}{2} * N_{FFT}, & \text{if } NyqBand \text{ is odd} \end{cases} \quad (20)$$

where NyqBand indexes the Nyquist band, thus, NyqBand=1, for the first Nyquist band, NyqBand=2 for the second Nyquist band etc., and $N_{FFT}$ is the number of bins in the FFT, as previously described Having determined the timing delay mismatch estimates and their respective uncertainties, in block 308 it is determined if, for any value of i=1, 2, 3, a $\tau_i$ exceeds a preselected delay threshold $th_1$ and the corresponding uncertainty $\sigma_{\tau_i}^2$ is less than a preselected uncertainty threshold, $th_2$. The threshold $th_2$ may be a constant, or, alternatively, may be a function of $\tau_i$, for example, $th_2 = \tau_i^1/4$. By way of further example, in at least some embodiments $th_1$ may be 20 femtoseconds (fs), and $th_2$ may be $(20fs)^2/4$. If, in block 308, no delay mismatch estimate and its uncertainty satisfy the foregoing, block 308 proceeds by the "No" branch and returns to block 306, where method 300 continues to update the frequency dependent mismatch profile estimates and delay mismatch estimates.

If, however, one or more of the $\tau_i$ and its corresponding uncertainty $\sigma_{\tau_i}^2$ satisfy the foregoing test in block 308, block 308 proceeds by the "Yes" branch to block 310. In block 310, the delays to be corrected in the analog loop described above in conjunction with FIG. 1 are defined. First define $i_{corr}$ as the set of indices corresponding to the $\tau_i$, $\sigma_{\tau_i}^2$ that satisfy the test in block 308, and $i_r$ as the remaining indices. Taking, as a concrete example for the purpose of illustration, an embodiment of an interleaved ADC 4 having four component ADCs 6, then the index, i, runs from 1 to 3. Stated differently, the index i takes values in the set $\{1, 2, 3\}$. Continuing with the concrete example, suppose $\tau_{\tau_2}^2$ and $\tau_3$, $\sigma_{\tau 3}^2$ and satisfy the criteria in block 308. Then $i_{corr}$ includes values 1 and 3, that is, $i_{corr}$ is the set $\{1, 3\}$ and $i_r$ takes the value 2, that is, in the set-theoretic complement which includes the single value 2. In block 310, further define for all i in $i_{corr}$, $\tau_{ana,i} = \tau_i$, and for all for all i in $i_r$, $\tau_{ana,i} = 0$.

With the foregoing definitions, method 300 proceeds to block 312, where the second phase, referred to as the delay only estimation phase, is entered. In block 312, the delay mismatches of the component ADCs 6 corresponding to the indices $i_{corr}$ are corrected in analog. The delays may be corrected by adding a value $c_i$ to a current value of a code input to the respective ones of DACs 142, which code sets the output signal of the DACs, thereby determining a phase shift of the corresponding phase shifter 144, as described above. The $c_i$ may be determined by equations (21) and (22):

$$c_i = \tau_{ana,i}/\tau_{RES,i}, \text{ for all } i \text{ in } i_{corr} \text{ and} \quad (21)$$

$$c_i = 0, \text{ for all } i \text{ in } i_r. \quad (22)$$

Here $T_{RES,i}$ is the resolution of the $i_{th}$ DAC 104, that is, the phase shift, in units of time, produced by an increment of the least significant bit in the DAC code. DAC resolution will be described further below. In at least some embodiments, the operations in block 312 may be performed by a DAC scale estimator 122 and DAC scale logic 124 (FIG. 1). For example, the $c_i$ may be output by DAC scale logic 124 to summing block 127 to be added to the current code value 129 (FIG. 1B).

In block 314, the gating signals $S_k(b)$, $S'_k(b)$ are set based on the set of FFT bins having an uncertainty in the filtered frequency domain mismatch profile estimate output from the OMTF 108 that satisfies (e.g., that are less than) a preselected uncertainty threshold criterion, $th_{unc}$. Thus, let B denote the set of bins for which $R_{G_k}^{KF}(B) < th_{unc}$ for all values of k, where k indexes the interleaving images. Let the remaining bins, that is those bins which do not satisfy the foregoing inequality for all k, be denoted by $B^c$. Further, let a set of bins, denoted $B_n$, be defined as those satisfying: $S_k(B_n)=0$, $R_{G_k}^{KF}(B_n) < th_{unc}$. Note that correction of delays in analog proceeds iteratively, as will be further described below. At the first iteration, the set of bins $B_n$ equals the set of bins B. Upon iteration, the set of bins $B_n$ evolves, based on the foregoing defining expressions. At a current iteration (after the initial entry onto block 314), the $B_n$ at the current iteration are a subset of the $B^c$ in the previous iteration. The gating signals $S_k(b)$, $S'_k(b)$ may now be set in accordance with equations (23) and (24):

$$S_k(B)=1, S_k(B^c)=0, \text{ and} \quad (23)$$

$$S'_k(B)=0, S'_k(B^c)=1. \quad (24)$$

In the foregoing, the setting of the gating signals is based on an exemplary embodiment in which the value 0 signals on gate to close and the value 1 signals a gate to open. As would be appreciated by those skilled in the are having the benefit of the disclosure, complementary values may be used to signal the gates to open or close, and, correspondingly, the complements of equations (23) and (24) would be used in block 314, and similarly in the defining the set $B_n$ above.

The outputs of the OMTF may be adjusted for the delay mismatches that are to be corrected in the analog loop. Thus, in block 316, components to be corrected in the analog loop are removed from the OMTF estimate. Stated otherwise, a frequency domain mismatch profile based on the correction of the timing delay mismatch is removed from the filtered frequency domain mismatch profile estimate. The component may be removed by correcting the estimate $G_k^{KF}(B_n)$ using equations (25) and (26):

$$G_k^{KF}(B_n) = G_k^{KF}(B_n) - G_{k,corr}^{KF}(B_n, \tau_{ana}), \text{ where} \quad (25)$$

$$G_{k,corr}^{Kf}(b, \tau) = \frac{j2\pi b f_{res}}{N} \sum_{i=1}^{N-1} \left(\tau_i e^{-\frac{j2\pi i k}{N}}\right), \quad (26)$$

$$k = 1, 2, \ldots, N-1,$$

also shown schematically in the input-output diagram 402 (FIG. 4).

In the exemplary case of N=4, equation 26 becomes:

$$G_{k,corr}^{KF}(b, \tau) = \frac{j2\pi b f_{res}}{4}[\tau_1(-j)^k + \tau_2(-j)^{2k} + \tau_3(-j)^{3k}], \quad (26a)$$

$$k = 1, 2, 3.$$

In block 318, the DMTF is reset, wherein the DMTF states and uncertainties are forced to their initial values, as, for example, set forth in equations (1) and (2) above. Reset logic 120 (FIG. 1) may implement block 318, in at least some embodiments.

In block 320, a subtraction term i.e., the signal 113 input to $\Delta$ 111 (FIG. 1) denoted $G_{k,SUB}^{\tau, KF}(B)$, is set to the estimates from the OMTF 108:

$$G_{k,SUB}^{\tau, KF}(B) \equiv G_k^{KF}(B). \quad (27)$$

The differencing block may also receive, via switch fabric 110 the signal 115 comprising the instantaneous frequency domain estimates $G_k(B)$ from frequency domain estimator 104, and return the difference signal 117 to switch fabric 110. The switch fabric, in response to the gating signals as set in block 314 may then couple the difference signal 117 to the input of the DMTF 112. This is also shown schematically in input-output diagram 404 (FIG. 4).

In block 322, the inputs, based on the gating signals as set in block 314, to the OMTF 108 and the DMTF 112 are processed as previously described. In particular, with respect to the DMTF 112, the inputs are processed in accordance with equations 1-20 except, as block 322 is included in the delay only estimation phase, the value of $R_{EXT}=0$. The outputs of DMTF 112 comprise timing delay mismatch correction error estimates, denoted $\Delta\tau_i$, for each of the values of i in $i_{corr}$ and a corresponding timing delay mismatch correction error estimate uncertainty, denoted $\sigma_{\Delta\sigma_i}^2$. As described above, in the delay only estimation phase, the correction of the frequency independent delays proceeds iteratively. In particular, method 300 loops over the blocks 312-324 and 328 to estimate errors in the analog delay correction. In this way, method 300 can account for nonlinearities and other sources of non-uniformity, such as temperature dependencies, in the mapping of a digital DAC code to the analog output of the DACs in the analog delay correction loop. As a concrete example, suppose a delay mismatch, $\tau$, of say 2 picoseconds (ps) with respect to one of the component ADCs is to be corrected. Suppose, in this example, the initial DAC step size, is 10 femtoseconds (fs), i.e., $\tau_{RES}=10$ fs. Then, in block 312, the DAC code is updated by (2 ps/10 fs) or 200. Now, suppose, because of the aforesaid non-idealities that may exist in a realization of a DAC, only 1.6 ps of the intended 2 ps is corrected in the analog loop This 0.4 ps difference may then be corrected by successive iterations, wherein such delay correction error estimates $\Delta\tau_i$ and the corresponding delay correction error estimate uncertainties, $\sigma_{\Delta\tau_i}^2$ may be reduced. This will now be described in conjunction with blocks 324, 328-332.

Turning to block 324, in block 324, the values of $\Delta\sigma_i$ are tested against a preselected threshold, $th_3$, and the corresponding delay correction error estimate uncertainties, $\sigma_{\Delta\tau_i}^2$ are tested against another preselected threshold, $th_4$ for all i in the set $i_{corr}$. The threshold $th_4$ may be a constant, or, alternatively, may be a function of $\Delta\tau_i$, for example, $th_4=\Delta\tau_i^2/4$. By way of further example, in at least some embodiments $th_3$ may be 10 fs, and $th_4$ may be $(10 \text{ fs})^2/4$. If, for any i in the set $i_{corr}$, either $|\Delta\tau_i|>th_3$ or $\sigma_{\Delta\tau_i}^2 \geq th_4$, then block 324 proceeds by the "No" branch to block 328 to iteratively correct the delay correction error estimates, as described above.

In block 328, the values of $\Delta\tau_i$ are again tested against the threshold, $th_3$, and the corresponding delay correction error estimate uncertainties, $\sigma_{\Delta\tau_i}^2$ are again tested against the threshold, $th_4$. If, for any i in the set $i_{corr}$, $|\Delta\tau_i|>th_3$ and $\sigma_{\Delta\tau_i}^2<th_4$, then block 328 proceeds by the "Yes" branch to block 330, where the DAC resolution estimates are updated. Otherwise, block 328 returns to block 322 to iterate until all delay correction error estimate uncertainties fall below the threshold $th_4$.

Turning to block 330, in block 330, as previously stated, the DAC resolution estimates are updated. The DAC resolution estimates may be updated in accordance with equation 28:

$$\tau_{RES,i}=c_i/(\tau_{ana,i}-\Delta\tau_i), \tag{28}$$

for all i in the set $i'_{corr}$ where the set $i'_{corr}$ is the subset of $i_{corr}$ for which the aforesaid conditions in block 328 are satisfied. And, for all i in $i'_{corr}$, the delays to be corrected in the analog loop are set, in block 332, Defining $i'_r$ to be the set of indices, i, complementary to $i_{corr}$, (i.e., the subset of $i_{corr}$ for which the conditions in block 328 are not satisfied) the delays to be corrected may be set in accordance with equations 29 and 30:

$$\tau_{ana,i}=\Delta\tau_i \tag{29}$$

for all i in the set $i_{corr}$, and $$\tau_{ana,i}=0 \tag{30}$$

for all i in the set $i'_r$.

In at least some embodiments, the operations in block 330 may be performed by a DAC scale estimator 122 and DAC scale logic 124 (FIG. 1).

Method 300 then returns to block 312 to correct the delay mismatches in the analog loop.

Turning again to block 324, if, in block 324 for all i in the set $i_{corr}$, both $|\Delta\tau_i|<th_3$ and $\sigma_{\Delta\tau_i}^2<th_4$, then all the delay mismatch error estimates and their respective uncertainties satisfy the conditions in block 324. Stated otherwise, the delay mismatch error estimates and their respective uncertainties are sufficiently small that the residual mismatch delay errors that correcting them in the analog loop may not provide much value. Block 324 proceeds by the "Yes" branch to block 326, where the residual delay mismatch errors may be corrected in digital in accordance with equation 31:

$$G_k^{KF}(B)=G_k^{KF}(B)+G_{k,corr}^{KF}(B,\Delta\tau), \tag{31}$$

for the set of all $\Delta\tau$, and where the set of bins, B has been defined in conjunction with block 314, and $G_{k,corr}^{KF}$ is defined in equations 26 and 26a for the cases of an IADC comprising N component ADCs and four component ADCs, respectively. In at least some embodiments, the $G_{k,corr}^{KF}$ may be calculated in an analog correction mismatch logic 126 (FIG. 1B) and input to a summing block 128 (FIG. 1B) to perform the addition in equation 31. Stated otherwise, at block 326, the filtered frequency domain mismatch profile estimate may be modified to correct the residual delay mismatch in digital by adding a frequency dependent correction based on the timing delay correction error to the filtered frequency domain mismatch profile estimate.

Method 300 returns to block 304 to continuously track mismatch timing errors in the IADC.

Figure 5:
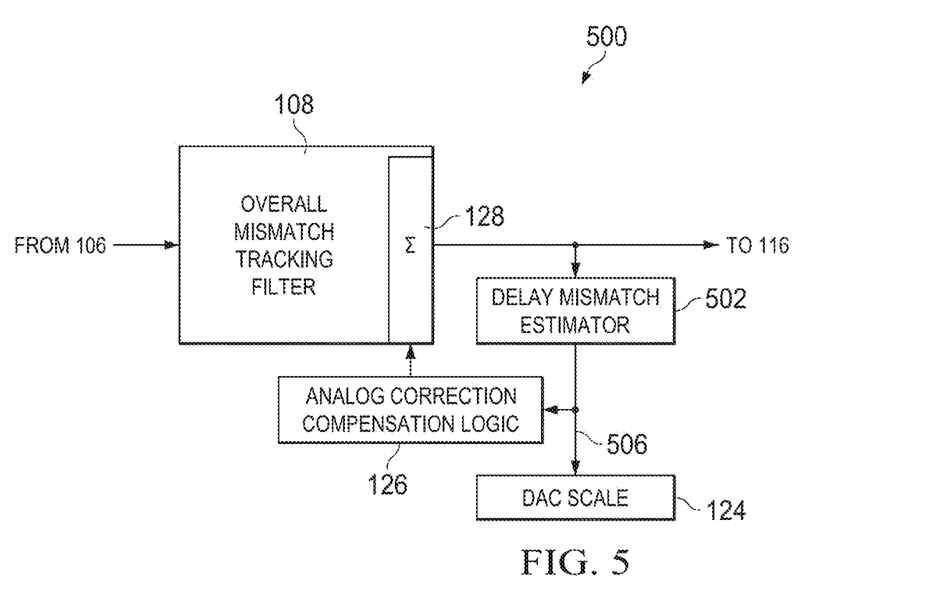
FIG. 5 shows a block diagram of portion of a system in accordance with various examples.

Turning to FIG. 5, FIG. 5 shows a portion 500 of a system for correcting mismatches in an interleaved ADC, in accordance with an alternative embodiment. Portion 500 may be used in conjunction with portions of system 2, FIGS. 1A, 1B. Portion 500 may be used to estimate, and correct in the analog loop, a timing delay mismatch in the all estimation phase, with timing delay mismatch correction errors corrected in the delay only estimation phase, as described above in conjunction with blocks 322-324, 328-332 and 326 (FIG. 3). Portion 500 includes OMTF 108, summing block 128, analog correction compensation logic 126 and DAC scale logic 124 as described above. A delay mismatch estimator 502 is coupled to the output of OMTF 108. The delay mismatch estimator 502 may output a frequency independent timing delay mismatch estimate 506 based on the filtered frequency domain mismatch profile estimates, $G_k^{KF}$(b), 504 from the OMTF 108. For example, a frequency independent delay may be represented in the frequency dependent mismatch profile estimates 504 as a linear ramp in frequency. A slope of the linear ramp corresponds to the frequency independent delay. Thus, delay mismatch estimator 502 may estimate the slope of the $G_k^{KF}$(b). The slope corresponds to the estimate 506 of the timing delay mismatch. The timing delay mismatch estimate 506 may be provided to DAC scale logic 124 and analog correction compensation logic 126, as described above. Thus, stated differently, the output of delay mismatch estimator 502 may determine a correction of the timing delay mismatch. With reference to FIG. 3, in an embodiment in which the frequency independent delay mismatch is estimated in accordance with portion 500, the delay mismatch estimator 502 may be disabled on entering the delay-only estimation phase, at block 312. Otherwise, method 300 proceeds as described in conjunction with FIG. 3.

Figure 6:
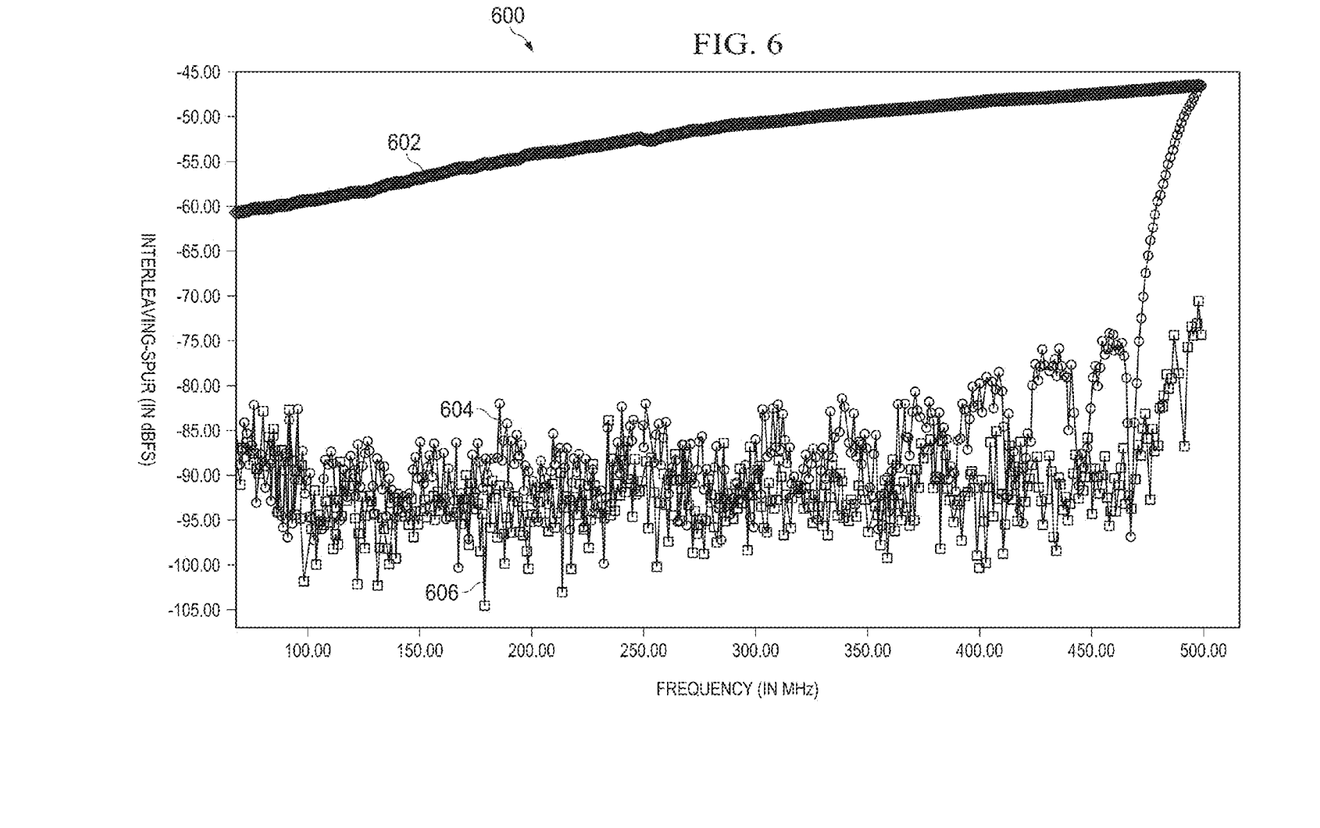
FIG. 6 shows a graph of interleaving spurs in accordance with various examples.

FIG. 6 shows a graph 600 of average interleaving spur levels in accordance with various examples. Each of curves 602-606 shows interleaving spur levels (in decibels relative to full scale, or dBFS) as a function of frequency over a frequency range from 0 to 500 MHz, with a sampling frequency of 1 GHz. Curve 602 shows interleaving spurs as a function of frequency without any correction. Curve 604 (circles) shows interleaving spurs as a function of frequency with digital correction only, wherein the mismatch corrector comprises a 32-tap time domain filter. Curve 606 (squares) shows interleaving spurs as a function of frequency with both digital and analog mismatch correction as described hereinabove, with the mismatch corrector comprising a 24-tap time domain filter. Thus, in the example of graph 500, including both digital and analog correction in accordance with the principles of the disclosure has allowed for the reduction in the digital correction filter length, with lower average spur levels compared to digital-only correction.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
a first tracking filter configured to track a frequency domain mismatch profile between component analog-to-digital convertors (ADCs) of an interleaved ADC;
a second tracking filter configured to a track a frequency independent timing delay mismatch and a timing delay mismatch correction error based on frequency domain mismatch profile estimates; and wherein:
an output of the first tracking filter determines a correction of a frequency dependent mismatch profile in an output of the interleaved ADC and an output of the second tracking filter determines a correction of the timing delay mismatch correction error in the output of the interleaved ADC.

2. The system of claim 1 further comprising control logic coupled to the first and second tracking filters, and wherein the control logic is configured to:
couple a frequency domain mismatch profile estimate to the first and second tracking filters in a first correction phase; and
couple a difference of the frequency domain mismatch profile estimate and the output of the first tracking filter to the second tracking filter in a second correction phase.

3. The system of claim 2 wherein the control logic is further configured to couple the difference of the frequency domain mismatch profile estimate and the output of the first tracking filter to the second tracking filter based on each frequency bin in a frequency domain.

4. The system of claim 1 further comprising logic coupled to the output of the second tracking filter, the logic configured to adjust a phase shift of a clock signal coupled to a clock input of a component ADC of the interleaved ADC based on one or both of a frequency independent timing delay mismatch estimate and the timing delay mismatch correction error.

5. The system of claim 4 wherein the logic coupled to the output of the second tracking filter is further configured to adjust a timing code coupled to a digital-to-analog convertor (DAC) based on one or both of the frequency independent timing delay mismatch estimate and the timing delay mismatch correction error, an output of the DAC configured to adjust the phase shift of the clock signal coupled to the clock input of the component ADC of the interleaved ADC.

6. The system of claim 5 wherein the logic coupled to the output of the second tracking filter is further configured to adjust a resolution of the timing code based on the timing delay mismatch correction error.

7. The system of claim 1 further comprising a delay mismatch estimator coupled to the output of the first tracking filter, and wherein the output of the delay mismatch estimator determines a correction of the timing delay mismatch.

8. The system of claim 1 wherein the output of the second tracking filter further determines a correction of a timing delay mismatch.

9. The system of claim 3 wherein the control logic is further configured to couple the frequency domain mismatch profile estimate to the first tracking filter based on each frequency bin in the frequency domain.

10. A method comprising:
continuously tracking frequency domain mismatch profiles in an interleaved analog-to-digital convertor (IADC), the continuous tracking comprising:
in a first phase:
based on the tracking, estimating a frequency independent timing delay mismatch between a first component analog-to-digital convertor (ADC) of the IADC and a second component ADC of the IADC;
correcting, in an analog loop, the timing delay mismatch; and
in a second phase following the first phase, based on the tracking: estimate an error in a timing delay mismatch correction.

11. The method of claim 10 further comprising:
estimating, in a first tracking filter, a filtered frequency domain mismatch profile estimate based on an instantaneous frequency domain mismatch profile estimate.

12. The method of claim 11 further comprising:
adjusting the filtered frequency domain mismatch profile estimate based on the timing delay mismatch.

13. The method of claim 12 wherein the adjusting the filtered frequency domain mismatch profile estimate comprises removing a frequency domain mismatch profile based on a correction of the timing delay mismatch from the filtered frequency domain mismatch profile estimate.

14. The method of claim 11 further comprising:
correcting a timing delay correction error by modifying the filtered frequency domain mismatch profile estimate from the first tracking filter.

15. The method of claim 14 wherein modifying the filtered frequency domain mismatch profile estimate comprises adding a frequency-dependent correction based on the timing delay correction error to the filtered frequency domain mismatch profile estimate.

16. The method of claim 10 wherein correcting the timing delay mismatch comprises:
determining if:

a timing delay mismatch estimate exceeds a first preselected threshold; and a corresponding uncertainty in the timing delay mismatch estimate is less than a second preselected threshold.

17. The method of claim 16 wherein:

if the determining is true, correcting the timing delay mismatch by adding a value to a first code input to a digital-to-analog convertor (DAC) to generate a second code value, wherein an output of the DAC is configured to shift a phase of a clock signal coupled to a component ADC based on the second code value.

18. An integrated circuit (IC) comprising:

an interleaved analog-to-digital converter (IADC) comprising a number N of component analog-to-digital converters (ADCs) that are each configured to sample an analog signal in response to a clock signal;

a frequency domain processor to generate a discrete frequency domain representation of an IADC signal;

a first tracking filter configured to track frequency domain mismatch profiles based the frequency domain representation of the IADC signal and output filtered frequency domain mismatch profile estimates configured to determine a digital correction of interleaving mismatches between the component ADCs in an output of the IADC; and a second tracking filter configured to track a frequency independent timing delay mismatch and a timing delay mismatch correction error based on frequency domain mismatch profile estimates, wherein an output of the second tracking filter determines a correction of the timing delay mismatch correction error in the output of the IADC.

19. The IC of claim 18 further comprising:

a plurality of phase shifters, each phase shifter coupled to a clock signal and a clock input to each of the number N−1 of the component ADCs; and a plurality of digital-to-analog convertors (DACs), an output of each DAC of the plurality of DACs coupled to one of the plurality of phase shifters; wherein:

each phase shifter is configured to shift a phase of the clock signal and output the phase-shifted clock signal to the clock input of a respective one of the number N−1 of the component ADCs, the phase shift based on the output of the DAC; and the output of each DAC is based on an input to the DAC selected from the group consisting of:

a code based on a timing delay mismatch estimate, wherein the timing delay mismatch estimate corresponds to the respective one of the number N−1 of ADCs; and a code based on the timing delay mismatch correction error estimate.

20. The IC of claim 18 wherein the first and second tracking filters comprise Kalman filters.

21. The IC of claim 18 further comprising logic configured to:

reset the second tracking filter; and subtract from instantaneous mismatch profile estimates at an input to the second tracking filter a subset of the filtered frequency domain mismatch profile estimates from the first tracking filter.

22. The IC of claim 18 further comprising a delay mismatch estimator coupled to an output of the first tracking filter, the delay mismatch estimator configured to estimate the timing delay mismatch based on the filtered frequency domain mismatch profile estimates.

23. The IC of claim 18 wherein the output of the second tracking filter further determines a correction of the timing delay mismatch.

* * * * *